Nov. 3, 1964 | J. KEMENY ETAL | 3,155,893

TUNER ACTUATOR MECHANISM

Filed May 2, 1960 | 5 Sheets-Sheet 1

INVENTORS:
JULIUS KEMENY,
CHARLES E. CADY,
MERTIS E. JONES,
JOHN M. PARSONS,

BY Norman C. Fulmer
THEIR ATTORNEY.

Nov. 3, 1964 J. KEMENY ETAL 3,155,893

TUNER ACTUATOR MECHANISM

Filed May 2, 1960 5 Sheets-Sheet 2

INVENTORS:
JULIUS KEMENY,
CHARLES E. CADY,
MERTIS E. JONES,
JOHN M. PARSONS,

BY Norman C. Fulmer
THEIR ATTORNEY.

INVENTORS:
JULIUS KEMENY,
CHARLES E. CADY,
MERTIS E. JONES,
JOHN M. PARSONS,

BY Norman C. Fulmer
THEIR ATTORNEY.

Nov. 3, 1964 J. KEMENY ET AL 3,155,893

TUNER ACTUATOR MECHANISM

Filed May 2, 1960 5 Sheets-Sheet 4

INVENTORS:
JULIUS KEMENY,
CHARLES E. CADY,
MERTIS E. JONES,
JOHN M. PARSONS,

BY Norman C. Fulmer
THEIR ATTORNEY.

TUNER ACTUATOR MECHANISM

Filed May 2, 1960

INVENTORS:
JULIUS KEMENY,
CHARLES E. CADY,
MERTIS E. JONES,
JOHN M. PARSONS,

BY Norman C. Fulmer
THEIR ATTORNEY.

United States Patent Office 3,155,893

Patented Nov. 3, 1964

3,155,893

TUNER ACTUATOR MECHANISM

Julius Kemeny, Liverpool, John M. Parsons, Baldwinsville, and Charles E. Cady and Mertis E. Jones, North Syracuse, N.Y., assignors to General Electric Company, a corporation of New York Filed May 2, 1960, Ser. No. 25,990
12 Claims. (Cl. 318—467)

This invention relates to tuner actuator mechanisms, and more particularly to a television receiver automatic tuner having power-operated channel selection and automatic preset fine tuning for each channel.

As is well known, conventional television tuners require means for selectively adjusting the tuner to receive signals of different television channels, and further means are required for fine-tuning the tuner for each channel setting. Certain prior-art power driven tuners, for example the tuning system disclosed in U.S. Patent No. 2,901,615 which is assigned to the same assignee of the present invention, have employed an arrangement of push buttons for electrically actuating a motor for adjusting the tuner to a channel selected by manually pushing a button. Each of these push buttons is individually rotatable for manual presetting of the fine tuning for each channel. After the fine tuning has thus been preset for each channel, the mechanism automatically sets the fine tuning to its preset condition for whichever channel the tuner is thereafter adjusted to receive. Although this type of prior art system is generally satisfactory, the dual functioning of the push buttons requires that they have a round shape so as to be rotatable. This has limited the appearance design flexibility. While this drawback could be at least partly obviated by providing an additional set of buttons for accomplishing the fine tuning such a solution would add to the complexity of manipulating the tuning system and would have a cluttered appearance.

An object of the present invention is to provide a channel-selecting tuner actuator mechanism having an improved arrangement for presetting the fine tuning for each channel.

Another object is to provide a power-driven channel-selecting tuner actuator mechanism having push buttons for actuating a motor, wherein fine tuning is accomplished independently of the push buttons.

A further object is to provide a tuner actuator mechanism which is simple to adjust.

Still further objects are to provide a power-driven tuner having a pleasing appearance and which is economical to manufacture.

Other objects of the invention will be apparent from the following description and claims, and from the drawing in which:

Figure 1:
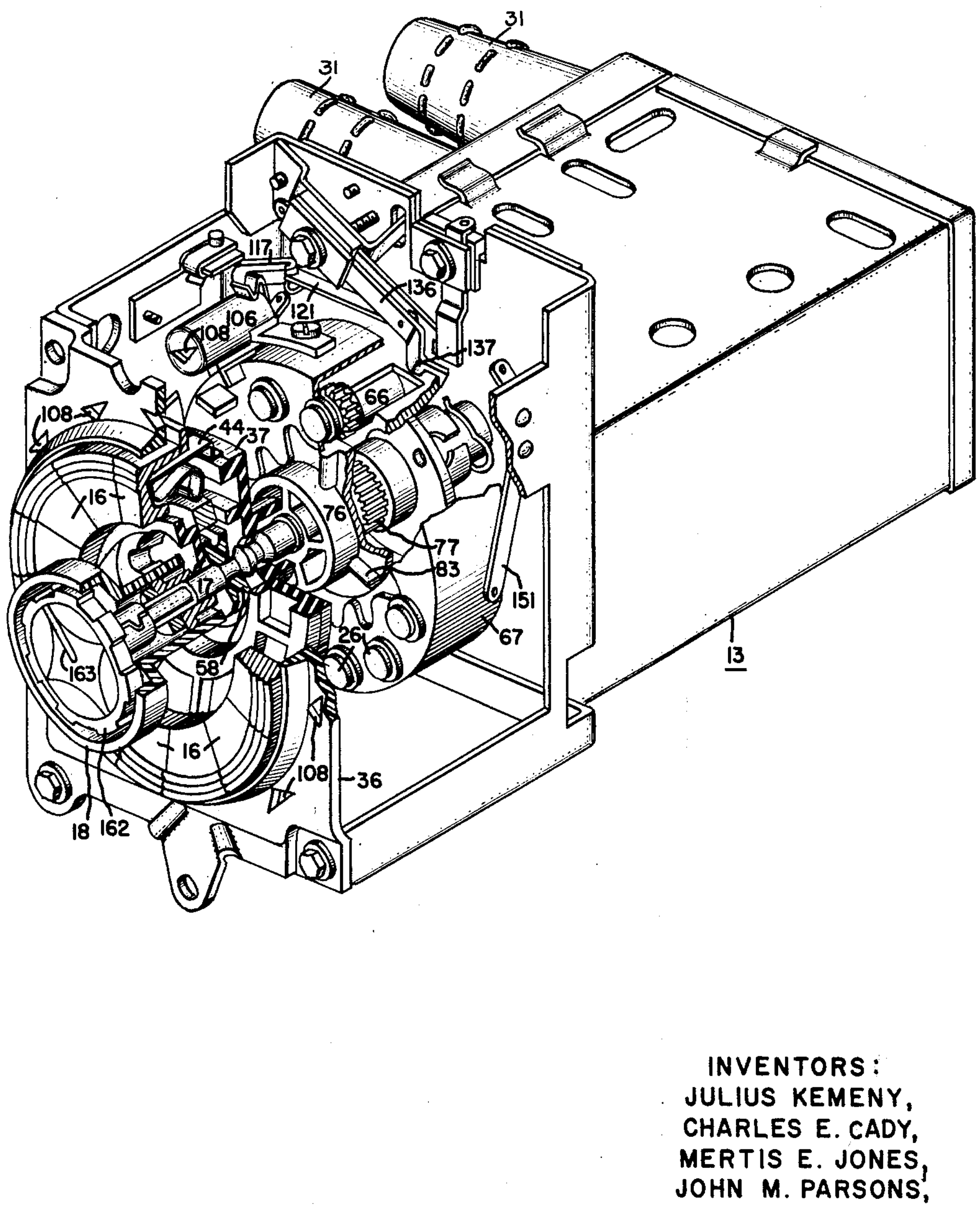
FIGURE 1 is a perspective view of a preferred embodiment of the invention, shown partly broken away to reveal internal construction details.
Figure 3:
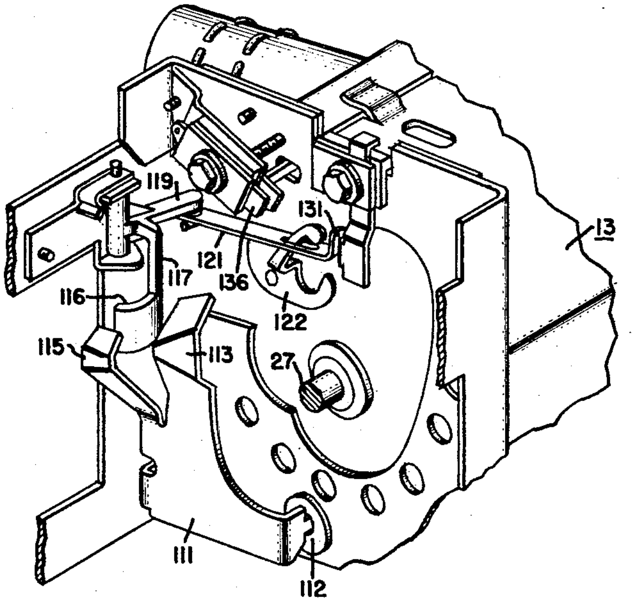
FIGURE 3 is a perspective view of the front part of a television tuner unit used in the preferred embodiment of this invention, showing details of a fine tuning linkage.

The invention, in its preferred embodiment, comprises a channel selecting unit having a plurality of push buttons arranged in a circle, each push button representing a different television channel. A control knob is concentrically centered within the push button arrangement. The control knob is attached to a rotatable control shaft having two axial positions, these axial positions being "in" for channel selection and "out" for fine tuning of whichever channel is selected. A fine tuning turret is coupled to the channel selecting shaft of a television tuner unit, and comprises a plurality of fine tuning adjustment screws arranged concentrically therein. A fine tuning linkage is arranged between the fine tuning turret and a fine tuning means of the tuner, whereby the fine tuning adjusting screws of the turret selectively are enabled to actuate the fine tuning means of the tuner. When the rotatable control shaft is in its "in" or channel selection position it engages and is capable of rotating the channel selecting shaft of the tuner unit, and when in its "out" or fine tuning position it is adapted to drive a gear arrangement for adjusting the fine tuning adjusting screw corresponding to the selected channel. A motor cut-out switch is automatically actuated when the control shaft is in its "out" position for fine tuning, to prevent the motor from accidentally rotating the tuner shaft and fine tuning turret while the fine tuning is being adjusted. After the fine tuning has been adjusted for a channel, it is "preset" and subsequent selection of the same channel automatically returns the fine tuning means of the tuner unit to the same setting.

Each of the push buttons is provided with an opening at the back thereof. A plurality of resilient U-shaped electrically conductive spring strips are respectively positioned in the openings of the push buttons, the ends of the legs of the U-shaped strips extending to the rear of the push buttons and being arranged to close an electrical connection for actuating a drive motor for the tuner unit when a push button is depressed. A contact release shoe is attached to the fine tuning turret and is arranged to release the aforesaid electrical connection when the motor has rotated the channel selecting shaft of the tuner unit to a selected channel, thereby stopping the shaft rotation when the desired channel is reached. A pilot light is attached to the fine tuning turret and is arranged to selectively light channel numbers on a channel number plate positioned around the push buttons at the front of the tuner mechanism, thereby to indicate the selected channel number.

Now referring to the drawing, the general organization of the tuner actuator mechanism of the invention comprises a channel selecting unit 11, a fine tuning turret 12, and a tuner unit 13. The channel selecting unit 11 comprises a plurality of push buttons 16, preferably twelve in number, arranged in a circle, a control shaft 17 being concentrically positioned at the center thereof and being provided with a control knob 18 attached to the outer end thereof. A channel number plate 19 is positioned around the circularly arranged push buttons 16 and is provided with numerals 21, from 2 to 13, which are respectively adjacent the twelve push buttons 16, and which represent the twelve presently standard very high frequency television channels. Preferably, a thirteenth push button is provided for selectively energizing an ultra high frequency television tuner unit. The arrangement of push buttons 16 and the channel number plate 19 remains stationary; i.e., they do not rotate.

The control shaft 17 is rotatable and is axially movable to two axial positions thereof, an "in" position and "out" position. As will be described in detail hereafter, when the control knob 18 is in its normal or "in" position the mechanism is adapted for accomplishing channel selection of the tuner unit 13, this channel selection being accomplished by manually turning the control knob 18 or by motor drive means electrically actuated when a selected push button 16 is depressed. When the control knob 18 is in its "out" position, manual rotation thereof accomplishes fine tuning adjustment of the tuner unit 13 for whichever channel is selected.

The fine tuning turret 12 comprises a plurality of fine tuning adjustment screws 26 circularly arranged therein, there being twelve of these fine tuning adjustment screws for a tuner having the conventional twelve channel positions. Each of the fine tuning adjustment screws 26 is associated with a different television channel, and is selectively adjustable by gear means coupled to the control shaft 17, as will be explained in detail hereafter. The fine tuning turret 12 is connected concentrically to a channel selecting shaft 27 of the tuning unit 13, this shaft 27 being rotatable and adapted to adjust channel tuning means of the tuner unit 13 for reception of signals in the different television channels, in a well known and conventional manner. When the control knob 18 is in its "in" or normal position, the control shaft 17 is connected to and rotates in unison with the tuner unit channel selecting shaft 27.

The tuner unit 13 is provided with electronic tubes which are shielded by shields 31 or transistors, and with internal electrical circuits for providing the functions of amplifying, mixing, and oscillating, as is well known, for the purpose of converting a received television signal into an intermediate frequency signal which is amplified and utilized in other television receiver circuits.

The channel selecting unit 11 will now be described in more detail. The push buttons 16 are arranged in a frame 36. A circular plate 37 made of electrically insulating material such as plastic is positioned behind the frame 36, the rim thereof being substantially directly behind the circularly arranged push buttons 16. A front contact ring 41 is positioned on the front side of the circular plate 37 near the rim thereof, and a rear contact ring 42 is positioned on the rear surface of the circular plate 37 near the rim thereof.

Each of the pushbuttons 16 is provided with an opening 43 in the rear end thereof. Resilient electrically conductive spring strips 44, each having a generally U-shaped configuration are respectively positioned in the openings of the push buttons 16, and are arranged so that one leg 45 of each spring strip 44 resiliently contacts the front contact ring 41, thereby making electrical contact therewith and also urging the push buttons 16 forwardly in the frame 36. The ends of the legs 45 of the spring strips 44 preferably are curled, as shown, to achieve proper resiliency. Shoulders 46 extending outwardly from the push buttons 16 at the rear ends thereof limit the forward travel of the push buttons 16, by engaging the back surface of the frame 36.

Figure 6:
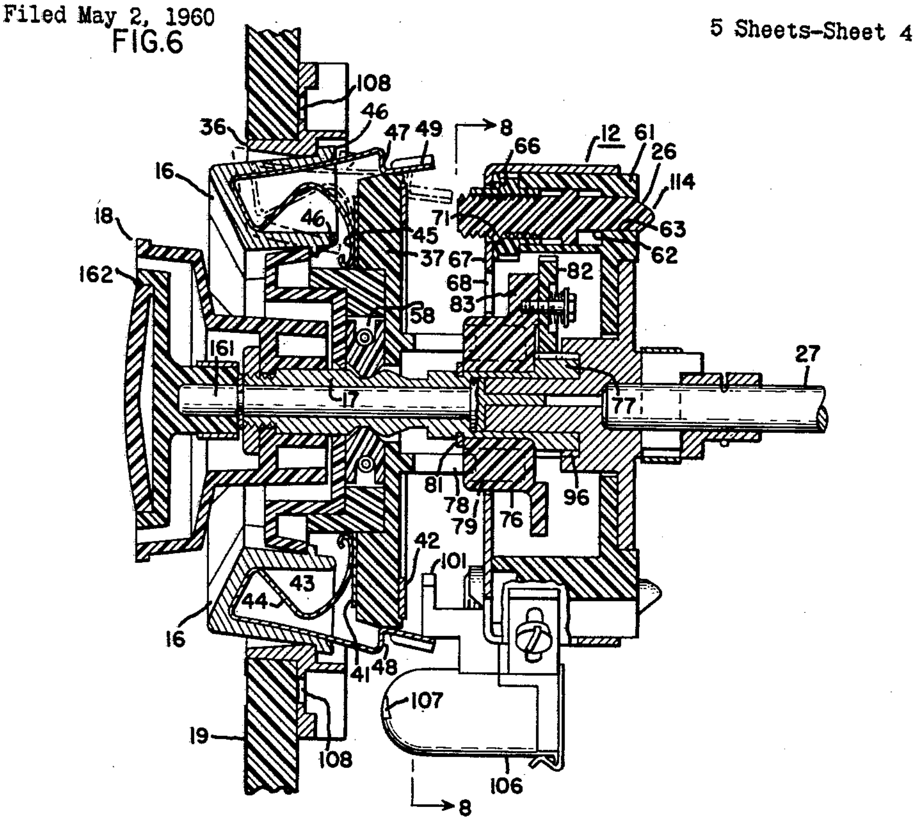
FIGURE 6 is a cross-sectional view of the preferred embodiment of the invention, taken on the line 6—6 of FIGURE 4.
Figure 7:
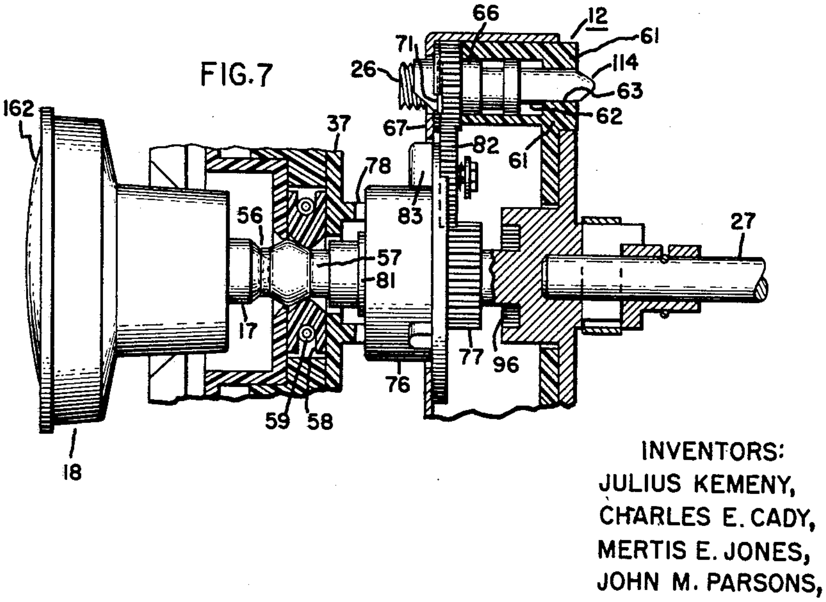
FIGURE 7 is a detailed view of a portion of the construction shown in FIGURE 6.
Figure 8:
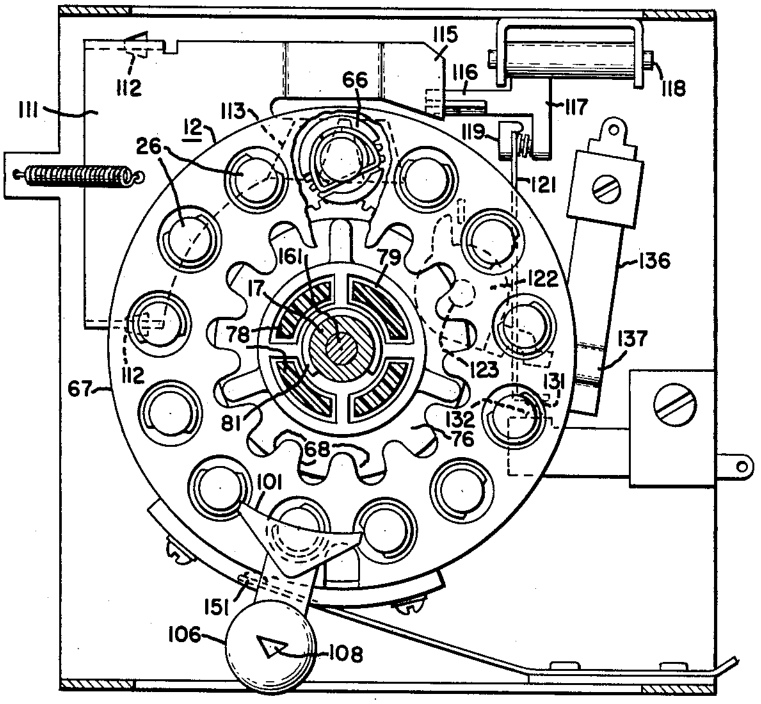
FIGURE 8 is a cross-sectional view taken on the line 8—8 of FIGURE 6.

The other leg of each of the spring strips 44 is shaped to provide a latch 47, this latch being formed by bending the strip 44 to provide an inwardly extending portion 48 and a rearwardly extending portion 49. The latch 47 of each of the spring strips 44 normally rests on the rim of the circular plate 37. When a push button 16 is depressed, the latch 47 of the spring strip 44 that is associated with the depressed button, moves forwardly and latches over the rear contact ring 42, as is clearly shown in FIGURE 6 of the drawing. The latch 47 will remain in this position, whereby the U-shaped spring strip 44 makes an electrical connection between the front and the back conductive rings 41 and 42, until the latch is released by means of a contact release shoe to be described hereafter.

The aforesaid "in" and "out" axial positions of the control shaft 17 preferably are provided by means of a pair of detents 56 and 57 located axially on the control shaft 17. An expansible disk 58 is positioned around the control shaft 17 and is adapted to selectively engage the detents 56 and 57 when the shaft 17 is moved axially, thereby holding the shaft in a desired axial position until the knob 18 is pushed or pulled to change the shaft 17 to its other axial position. The expansible disk 58 may comprise a radially segmented disk having an annular compression spring 59 placed around the rim thereof. Such an arrangement is more fully disclosed and is claimed in patent application Serial No. 26,020, filed May 2, 1960, concurrently herewith, now abandoned, and assigned to the same assignee as the present invention.

The fine tuning turret 12 will now be described in detail. The fine tuning adjustment screws 26 extend through a turret housing 61 in a direction parallel to the axis of the control shaft 17. Each of the adjusting screws 26 is captivated from rotation, for example by means of a flat surface 62 on the side thereof, which engages a shoulder 63 of the turret housing 61. Each adjusting screw 26 is provided with a gear nut 66 in threaded engagement therewith, these gear nuts 66 being captivated from axial movement by means of the turret housing 61 and a cover plate 67 positioned thereover. The cover plate 67 is provided with detents or notches 68, corresponding in number to the number of channel positions of the tuner, at the inner rim thereof. Each gear nut 66 preferably engages the thread of the associated tuning adjustment screw 26 by means of a resilient wire clip 71 attached to the gear nut 66 and extending laterally across the adjustment screw 26 and being in resilient engagement with the thread thereof. Such an arangement is more fully disclosed and is claimed in patent application Serial No. 26,335, filed May 2, 1960, concurrently herewith, now abandoned, and assigned to the same assignee as the present invention.

Figure 2:
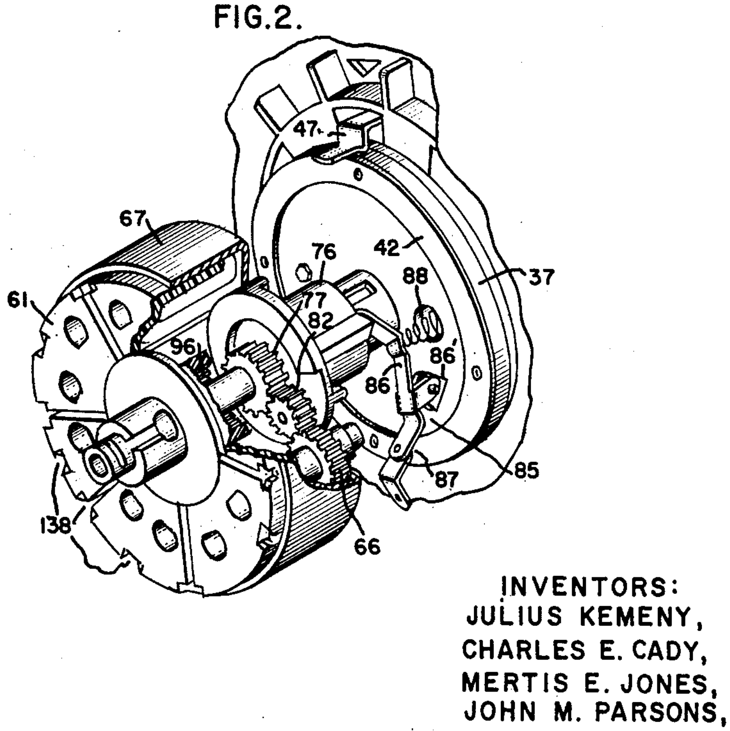
FIGURE 2 is a perspective view of a fine tuning turret, looking toward the rear thereof, which is a part of the invention.
Figure 4:
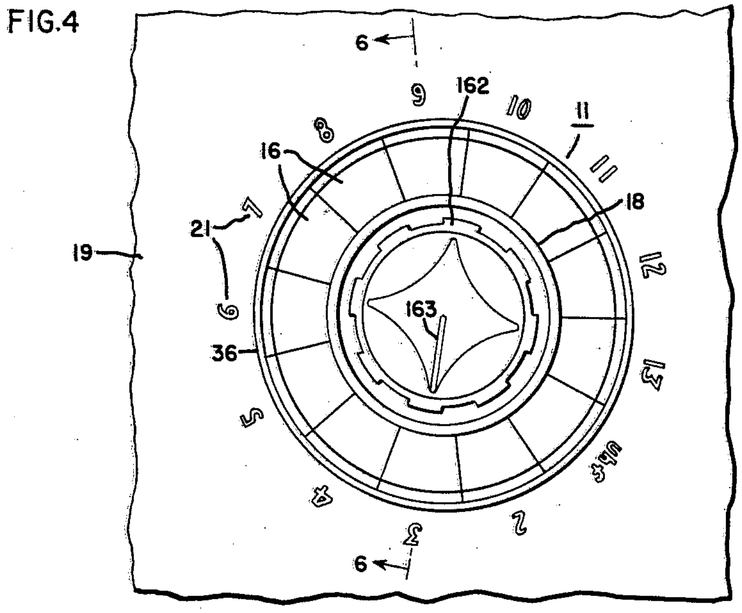
FIGURE 4 is the front view of the preferred embodiment of the invention.
Figure 5:
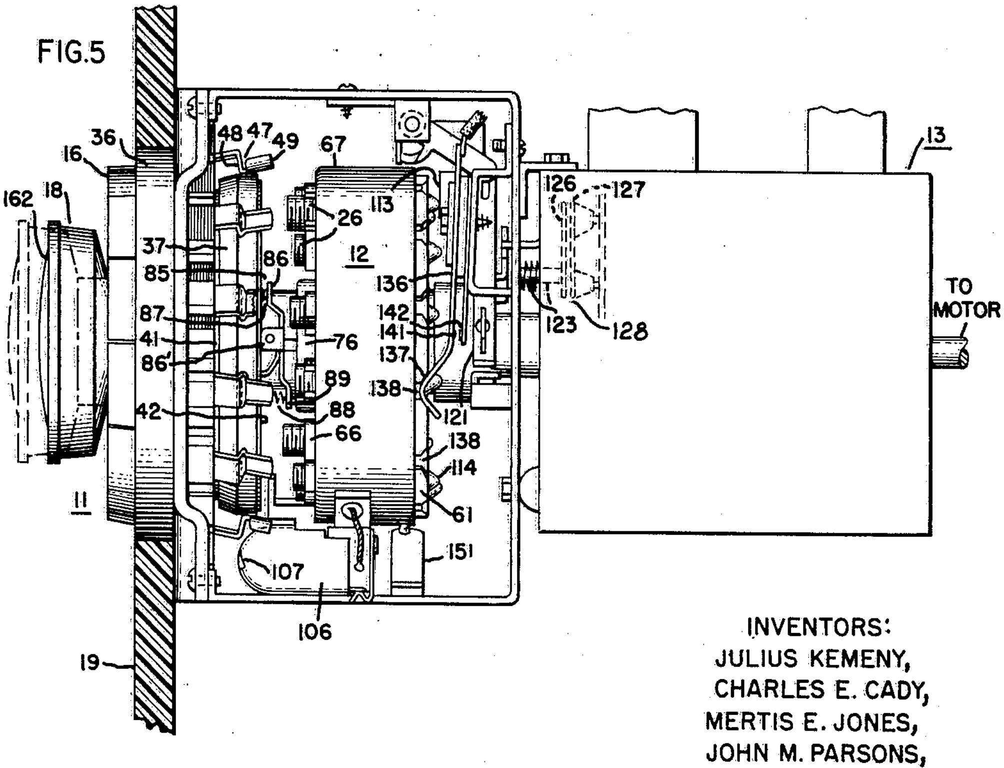
FIGURE 5 is a side view of the preferred embodiment of the invention.

A hub 76 is positioned around the control shaft 17 near the rear end thereof. The control shaft 17 extends slightly behind the hub 76 and is provided with a gear 77 at the rear end thereof. The hub 76 is captivated from rotational movement by means of shoulders 78 extending rearwardly from the circular plate 37 and into openings 79 in the hub 76. The hub 76 is captivated to the control shaft 17 for axial movement therewith, this being accomplished by the gear 77 at the rear surface of the hub 76, and by a washer 81 located in an annular groove in the shaft 17 at the front surface of the hub 76. A pinion gear 82 is attached to the hub 76 and its teeth are in engagement with the teeth of the control shaft gear 77. The pinion gear 82 is adapted to selectively engage the gear nuts 66 of the fine tuning adjustment screws 26, when the control knob 18 is pulled "out" to its fine tuning position as shown in FIGURE 2. One or more radial fins 83 are provided on the front surface of the hub 76, and are adapted to enter one or more of the notches 68 of the cover plate 67 when the knob 18 is in its "out" position, thereby locking the fine tuning turret 12 in place to prevent it from rotating when the fine tuning is being adjusted.

A fine tuning motor cut-out switch 85 comprises an arm 86 pivotally attached intermediate the ends thereof to the rear surface of the circular plate 37, as shown at 86'. One end of the switch arm 86 is provided with an electrical contact 87 adapted to engage against the rear contact ring 42. A coil spring 88 is provided between the circular plate 37 and the other end 89 of the switch arm 86, for urging the contact 87 toward the rear contact ring 42. The end 89 of the switch arm 86 extends in front of the hub 76, so that when the hub 76 (and the shaft 17 and knob 18) is in the "out" or fine tuning position, the hub 76 will force the end 89 of the switch arm 86 forwardly, thereby raising the contact 87 from the rear contact ring 42. When the hub 76 (and the shaft 17 and knob 18) is in its "in" or channel selecting position, the contact 87 engages the rear contact ring 42 due to the action of the coil spring 88.

The front end of the tuner unit channel selecting shaft 27 is provided with an internal gear 96, and when the control shaft 17 is in its "in" or channel selecting position the control shaft gear 77 engages the internal gear 96 thereby locking the control shaft 17 and tuner unit channel selecting shaft 27 together so that they will rotate in unison. When the control shaft 17 is in its "out" or fine tuning position, however, the control shaft gear 77 is out of engagement with the internal gear 96.

A contact release shoe 101 is attached to the fine tuning turret 12 so as to be rotatable therewith, and is wedge-shaped and adapted to engage and force outwardly and release any latch 47 which is in engagement with the rear contact ring 12. The rear portion 49 of the latch 47 is curved, as shown, to permit it to ride smoothly outwardly on the contact release shoe 101. When thus released, the latch 47 will return to its rest position against the rim of the circular plate 37, due to the resiliency of the spring strip 44, and this action restores the associated push button 16 to its rest position. A pilot light (not shown) is positioned in a pilot light housing 106 which is attached to and is rotatable with the fine tuning turret 12. An opening 107 is provided in the front end of the pilot light housing 106, through which light shines forwardly toward the frame 36.

The frame 36 is provided with a plurality of openings 108, these openings being respectively positioned radially outwardly from the push buttons 16 and being respectively located behind the channel numbers 21. The channel number plate 19 is transparent or translucent, or the channel members 21 are transparent or translucent, so that when the pilot light housing 106 is aligned behind an opening 108 in the frame 36, light will pass therethrough and illuminate an area of the number plate 19 at the channel number 21 corresponding to the channel setting of the tuner. The openings 107 and 108 are triangularly shaped, with a corner of the triangle being in a direction toward the control shaft 17. The front of the frame 36 has a dark color, so that the number plate 19 appears generally dark. The back of the number plate 19 is translucently colored, for example red, in the vicinity of the channel numbers 21. Thus, light from the housing 106 creates a colored triangular illuminated area at the channel number 21 of whichever channel the tuner is adjusted to receive, thereby visually indicating the selected channel.

A fine tuning plate 111 is positioned at the front of the tuner unit 13, and is hinged thereto at 112 so that the fine tuning plate 111 can generally swing toward or away from the front of the tuner unit 13. The fine tuning plate 111 is provided with a cam surface 113 extending frontwardly thereof and adapted to be selectively engaged by the fine tuning adjustment screws 26, the ends of the adjustment screws 26 being beveled as indicated at 114 to facilitate this engagement.

When the fine tuning turret 12 is rotated, the beveled ends 114 of the fine tuning adjustment screws 26 will sequentially engage the cam surface 113 thereby swinging the fine tuning plate toward the front surface of the tuner unit 13 to various extents determined by the different depths of projection of the fine tuning screws from the rear of the turret housing 61, which in turn is determined by the adjustment settings of the individual gear nuts 66.

The fine tuning plate 111 is provided with an extension arm 114 which bears against an end 116 of a rocker arm 117 which pivots about a pin 118. The rocker arm 117 is provided with a leg 119 to which an end of a link member 121 is pivotally attached. The link member 121 is linked to a rocker plate 122 which is attached to a shaft 123 extending into the tuner unit 13 and having a capacitor 128 plate 126 attached to the end thereof.

The capacitor plate 126 is capacitively associated with a fixed or stator plate 127 within the tuner unit 13.

The capacitor plates 126 and 127 form a fine tuning variable capacitor of which 127 is the stator plate and 126 is the rotor plate. The rotor plate 126, being attached to the rotatable shaft 123, swings with respect to the stator plate 127 in accordance with the position of the fine tuning plate 111, which position in turn is selectively determined by the settings of the individual fine tuning adjustment screws 26. Thus, for each channel position of the tuner channel selecting shaft 27, a corresponding fine tuning adjustment screw 26 will be in engagement with the cam surface 113 of the fine tuning plate 111, and the axial setting of this adjustment screw 26 will determine the capacitance between the plates 126 and 127, thereby providing for individual preset fine tuning for each television channel.

The end of the link member 121 near the rocker plate 122 is provided with a contact 131 which is adapted to engage a fixed contact 132 whenever the cam surface 113 of the fine tuning plate 111 is not depressed by a fine tuning adjustment screw 26. The contacts 131 and 132 provide a programming switch 133 which is electrically connected in the driving motor circuit in such manner that the motor circuit will be actuated unless the cam surface 113 is depressed by a fine tuning adjustment screw 26. Thus, it is possible to program the automatic tuner so that it will not stop on any channels which are undesired or for which a signal is not available. This programming is done very simply by setting the fine tuning adjusting screws 26 which are associated with the channels that are not to be received, to their retracted position so that these screws cannot engage the cam surface 113.

A resilient detent switch blade 136 is curved convexly at an end 137 thereof, so as to engage detents 138 at the rim of the fine tuning turret housing 61. A contact 141 is carried by the resilient detent switch blade 136 and cooperates with a fixed contact 142. Each of the detents 138 corresponds to the position of the fine tuning turret housing 61 for receiving a television channel. The convexly shaped end 137 of the switch blade 136 rides into the detents 138 as the turret housing 61 is rotated, whereby the switch contacts 141 and 142 become electrically separated at each channel position of the fine tuning turret 12. The contacts 141 and 142 provide a detent switch 143, which may be connected in the circuit of a remote control channel selection arrangement, for opening the motor circuit at each channel position of the tuner, as disclosed in copending patent application Serial No. 819,581 filed June 11, 1959, now U.S. Patent No. 2,956,161, and assigned to the same assignee as the present invention.

A resilient contact blade 151 engages the surface of the turret cover plate 67, this turret cover plate being made of metal. The pilot light in the pilot light housing 106 is electrically energized by being connected between the cover plate 67 and the electrically grounded tuning shaft 27, the cover plate 67 being electrically energized due to the sliding contact of the contact blade 151 therewith, this contact blade 151 being connected to a source of electrical potential.

Figure 9:
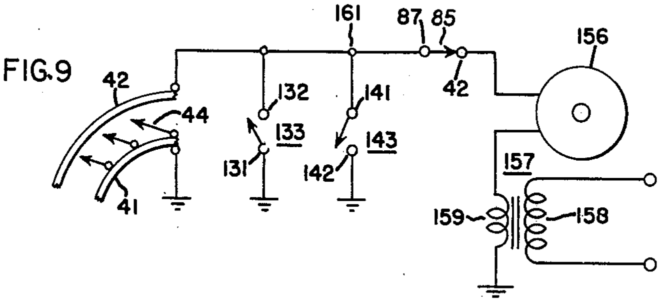
FIGURE 9 is a schematic diagram of the electrical circuit of the invention.

Now referring to FIGURE 9, a drive motor 156 is mechanically connected to rotate the tuner unit channel selecting shaft 27 when the motor 156 is electrically energized. Energy for the motor 156 is provided by a transformer 157 having a primary winding 158 which is connected to a suitable source of alternating electrical power, and having a secondary winding 159 which has an end thereof electrically grounded. The other end of the secondary 159 is connected to a terminal of the motor 156. The other terminal of the motor 156 is connected, via the fine tuning motor cut-out switch 85, to a junction 161. The programming switch 133, the detent switch 143, and the push button arrangement comprising a plurality of spring strips 44, are all connected in parallel between the junction 161 and electrical ground.

In the preferred embodiment of the invention, the control shaft 17 is hollow, and a channel indicating shaft 161 extends therethrough, the inner end of this shaft 161 being attached to the tuner channel selecting shaft 27 for rotation therewith and at the same time being axially slideable with respect thereto, and the outer end of this channel position indicating shaft 161 has a channel indicator knob 162 attached thereto. The channel indicator knob 162 is positioned concentrically within the control knob 18, and is provided with a channel indicator mark 163 near the rim thereof. The channel indicator knob 162 rotates with the tuner unit channel selecting shaft 27 whereby the channel indicator mark 163 will always point to the proper channel member 21 for indicating which channel the tuner unit 13 is adjusted to receive. This channel position indicating arrangement is fully described and is claimed in copending patent application Serial No. 26,000, filed concurrently herewith, now U.S. Patent No. 3,054,379, and assigned to the same assignee as the present invention.

The tuner mechanism functions as follows. With the control knob 18 in the "in" or channel selection position, whereby the control shaft gear 77 engages the internal gear 96 of the tuner channel selecting shaft 27, channels may be selected by turning the control knob 18 manually, in which event the fine tuning turret 12 rotates correspondingly, carrying the pilot light housing 106 therewith for indicating the channel number 21 corresponding to the channel that the tuner unit 13 is adjusted for receiving.

For power driven operation, a push button 16 is depressed corresponding to the desired channel, whereby the spring strip 44 and its latch 47 closes the motor circuit whereupon the motor 156 rotates the tuner channel selecting shaft 27 until the contact release shoe 101 rotates to a position where it engages and releases the closed latch 47. At the same time, the detent switch 143 opens, whereby the motor circuit is shut off and the tuner unit 13 is thus adjusted to the desired channel. When the rotating mechanism has reached the desired channel and stopped, one of the fine tuning adjustment screws 26 of the fine tuning turret 12 which corresponds to the selected channel, will be in engagement against the cam surface 113 of the fine tuning plate 111, thereby adjusting the fine tuning capacitor 128 to a given setting as determined by the preset adjustment of the adjustment screw 26.

To accomplish fine tuning, or to preset the adjustment screw 26, the knob 18 is pulled forwardly, thereby moving the hub 76 to its forward position whereby the pinion gear 82 engages the gear nut 66 of the fine tuning adjustment screw 26 that is in position against the cam surface 113. Upon manual rotation of the control knob 18, this fine tuning adjustment screw 26 is moved axially, thereby actuating the rocker arm and linkage mechanisms to change the value of the fine tuning capacitor 128. While the control knob 18 is in its "out" or fine tuning position, the fine tuning motor cut-out switch 85 is electrically opened, so that the motor 156 cannot accidentally operate and damage the fine tuning gear mechanism. After the fine tuning has been accomplished, the control knob 18 is pushed to the "in" or channel adjusting position. Once the fine tuning has thus been preset for each of the channels, the tuner will automatically become properly adjusted for fine tuning whenever any of the channels is selected.

The above described arrangement for providing circularly arranged push buttons and a concentric control knob having two axial positions for accomplishing channel tuning and fine tuning, accomplishes the desired objectives and presents a neat appearance and is easily manipulated. Furthermore, the described arrangement is electrically and mechanically reliable and efficient.

While a preferred embodiment of the invention has been shown and described, various other embodiments and modifications thereof will be apparent to those skilled in the art, but will fall within the scope of invention as defined in the following claims.

What we claim is:

1. An actuator mechanism for a tuner having a rotatable channel selection shaft and a fine tuning means, comprising a plurality of fine tuning adjustment means respectively associated with each channel and arranged to automatically set said fine tuning means to an individual preset condition for each channel position of said channel selection shaft, a rotatable axially adjustable control shaft, means coupling said control shaft to said channel selection shaft when said control shaft is in a first axial position, and means enabling said control shaft when in a second axial position to adjust the fine tuning adjustment means associated with whichever channel is selected by said channel selection shaft.

2. An actuator mechanism for a tuner having a channel tuning means and a fine tuning means, comprising power means for setting said channel tuning means for different channels, a plurality of push buttons arranged substantially in a circle and respectively being representative of different channels, means responsive when a button is depressed for actuating said power means to set said channel tuning means to the channel represented by the depressed button, a plurality of fine tuning adjustment means respectively associated with each channel and arranged to automatically set said fine tuning means to an individual preset condition for each channel setting of said channel tuning means, a rotatable axially adjustable control shaft positioned concentrically with respect to said circularly arranged push buttons, a control knob attached to said control shaft, means for coupling said control shaft to said channel tuning means when said control shaft is in a first axial position, and means enabling said control shaft when in a second axial position to adjust the fine tuning adjustment means associated with whichever channel has been selected.

3. An actuator mechanism as claimed in claim 2, including a channel number plate positioned around said arrangement of push buttons and provided with channel numbers respectively adjacent to said push buttons, a pilot light positioned behind said channel number plate, and means for causing said pilot light to selectively illuminate an area of said channel number plate at the channel number adjacent to the push button representative of whichever channel has been selected.

4. An actuator mechanism as claimed in claim 3, in which said channel number plate generally has a dark color and is provided with another color on the back side thereof at the locations of said channel numbers, whereby said illuminated area has a color different from the general coloring of said channel number plate.

5. An actuator mechanism for a tuner having a rotatable channel selection shaft and a fine tuning means comprising a fine tuning turret attached to said shaft and containing a plurality of adjustable fine tuning screws arranged concentrically about said shaft and being respectively representative of different channels selectable by rotation of said shaft, movable means adapted to be respectively engaged by said adjustable screws thereby to be moved to positions in accordance with the settings of said adjustable screws, means coupling said movable means to said fine tuning means, a rotatable and axially movable control shaft positioned in front of said channel selection shaft and in axial alignment therewith, a control knob attached to said control shaft at the front end thereof, means for coupling said control shaft to said channel selection shaft when said control shaft is in a first axial position, means enabling said control shaft when in a second axial position to adjust the setting of the fine tuning screw representative of whichever channel has been selected by said channel selection shaft, an electric motor for rotating said channel selection shaft, a plurality of push buttons arranged concentrically around said control shaft, a fixed contact, movable contacts respectively associated with said push buttons and respectively adapted to engage said fixed contact when the associated push button is depressed, circuit means for actuating said motor when any of said movable contacts engages said fixed contact, and a contact release shoe attached to said turret and adapted to engage and release any engaged movable contact from its engagement with said fixed contact when said channel selection shaft is rotated by said motor to a channel position corresponding to the channel represented by a depressed push button.

6. An actuator mechanism as claimed in claim 5, including a motor cut-out switch connected to deenergize said motor when said control shaft is in its second axial position.

7. An actuator mechanism as claimed in claim 5, in which a hub is positioned around said rotatable control shaft, means constraining said hub from rotating, means constraining said hub from moving axially with respect to said control shaft, a pinion gear positioned on said hub near the rim thereof and coupled to said control shaft to be rotated thereby, and a gear nut positioned on each of said fine tuning screws, said pinion gear being adapted to engage the gear nut of the fine tuning screw representative of the channel selected by said channel selection shaft when said control shaft is in its second axial position.

8. An actuator mechanism as claimed in claim 7, in which said fine tuning turret is provided with a plurality of detents arranged arcuately thereon, said hub being provided with at least one fin adapted to engage at least one of said detents when said control shaft is in its second axial position, thereby constraining said fine tuning turret from rotating.

9. An actuator mechanism as claimed in claim 7, including a motor cut-out switch connected to deenergize said motor when said control shaft is in its second axial position, said motor cut-out switch comprising a first contact, and a movable contact member carrying a second contact arranged to normally engage said first contact, said movable contact member being positioned to be engaged by said hub when said control shaft is in its second axial position thereby to break the engagement of said first and second contacts.

10. An actuator mechanism as claimed in claim 5, including a channel number plate positioned around said arrangement of push buttons and provided with channel numbers respectively adjacent said push buttons, and a pilot light attached to said fine tuning turret and adapted to project a beam of light toward said channel number plate to illuminate an area thereof at the channel number adjacent the push button that corresponds to the channel setting of the channel selection shaft.

11. An actuator mechanism as claimed in claim 5, including a circular plate positioned behind said arrangement of push buttons, first and second contact rings respectively positioned behind and in front of said circular plate near the rim thereof, each of said push buttons being provided with an opening in the rear thereof, U-shaped electrically conductive spring strips respectively positioned in said openings with the legs thereof extending rearwardly from said push buttons, one leg of each spring strip being in engagement with said second contact ring, and the other leg of each spring strip being shaped to provide a latch which normally rests on the rim of said circular plate and which latches over said first contact ring when the associated push button is depressed.

12. An actuator mechanism as claimed in claim 11, in which said contact release shoe is adapted to selectively engage and force outwardly for releasing the latch of any spring strip which is in a latched position.

References Cited by the Examiner

UNITED STATES PATENTS

| | | | |
|---|---|---|---|
| 1,965,281 | 7/34 | Deisch | 74—10.1 |
| 2,901,615 | 8/59 | Devendorf | 74—10.45 |
| 2,934,964 | 5/60 | Parsons | 74—10.45 |
| 2,947,866 | 8/60 | Valdettaro et al. | 74—10.27 |
| 2,962,903 | 12/60 | Kemeny | 74—10.27 |

ORIS L. RADER, *Primary Examiner.*

MILTON O. HIRSHFIELD, *Examiner.*